(12) United States Patent
Borrel et al.

(10) Patent No.: US 11,322,363 B2
(45) Date of Patent: May 3, 2022

(54) CONTACTS FOR ELECTRONIC COMPONENT

(71) Applicant: STMicroelectronics (Crolles 2) SAS, Crolles (FR)

(72) Inventors: Julien Borrel, Le Versoud (FR); Magali Gregoire, Crolles (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 47 days.

(21) Appl. No.: 16/892,732

(22) Filed: Jun. 4, 2020

(65) Prior Publication Data
US 2020/0388505 A1 Dec. 10, 2020

(30) Foreign Application Priority Data
Jun. 5, 2019 (FR) ...................................... 1905958

(51) Int. Cl.
| | | |
|---|---|---|
| *H01L 21/3205* | (2006.01) | |
| *H01L 21/321* | (2006.01) | |
| *H01L 21/265* | (2006.01) | |
| *H01L 21/324* | (2006.01) | |
| *H01L 21/762* | (2006.01) | |
| *H01L 29/45* | (2006.01) | |

(52) U.S. Cl.
CPC .. *H01L 21/32053* (2013.01); *H01L 21/26586* (2013.01); *H01L 21/324* (2013.01); *H01L 21/76224* (2013.01); *H01L 29/456* (2013.01)

(58) Field of Classification Search
CPC ......... H01L 21/32053; H01L 21/26586; H01L 21/76224; H01L 21/324; H01L 21/28518; H01L 29/456; H01L 29/665

USPC ........................................................ 438/966
See application file for complete search history.

(56) References Cited

U.S. PATENT DOCUMENTS

| | | | | |
|---|---|---|---|---|
| 5,177,027 A | | 1/1993 | Lowrey et al. | |
| 5,208,472 A | * | 5/1993 | Su ......................... | H01L 29/456 257/344 |
| 5,608,266 A | * | 3/1997 | Agnello ............ | H01L 21/28518 257/768 |
| 5,659,194 A | * | 8/1997 | Iwamatsu ......... | H01L 21/26506 257/377 |
| 5,691,225 A | * | 11/1997 | Abiko ............... | H01L 21/28518 257/E21.165 |
| 6,010,952 A | * | 1/2000 | Tsai .................. | H01L 21/26586 257/E21.165 |

(Continued)

FOREIGN PATENT DOCUMENTS

| | | |
|---|---|---|
| DE | 102005030875 A1 | 1/2007 |
| TW | 423056 B | 2/2001 |

OTHER PUBLICATIONS

Wolf et al., Silicon Processing for the VLSI Era, vol. 1-Process Technology, Lattice Press, Sunset Beach, CA,, 1986, pp. 323-325. (Year: 1986).*

(Continued)

*Primary Examiner* — Mary A Wilczewski
(74) *Attorney, Agent, or Firm* — Crowe & Dunlevy (57) ABSTRACT

Atoms are implanted in a semiconductor region at a higher concentration in a peripheral part of the semiconductor region than in a central part of the semiconductor region. A metallic region is then formed to cover the semiconductor region. A heat treatment is the performed to form an intermetallic region from the metallic region and the semiconductor region.

15 Claims, 4 Drawing Sheets

(56) References Cited

U.S. PATENT DOCUMENTS

| | | | | |
|---|---|---|---|---|
| 6,150,243 | A * | 11/2000 | Wieczorek | H01L 21/2255 438/558 |
| 6,204,132 | B1 * | 3/2001 | Kittl | H01L 21/26506 438/299 |
| 6,255,214 | B1 * | 7/2001 | Wieczorek | H01L 21/28518 257/E21.165 |
| 6,297,148 | B1 * | 10/2001 | Besser | H01L 21/28518 257/E21.165 |
| 6,376,342 | B1 * | 4/2002 | Tseng | H01L 21/02052 438/517 |
| 6,380,057 | B1 * | 4/2002 | Buynoski | H01L 21/26506 438/592 |
| 6,506,651 | B2 * | 1/2003 | Sayama | H01L 29/41766 438/301 |
| 6,589,836 | B1 * | 7/2003 | Wang | H01L 21/823814 257/E21.634 |
| 6,740,559 | B2 * | 5/2004 | Higuchi | H01L 29/6656 438/303 |
| 6,765,269 | B2 * | 7/2004 | Lee | H01L 21/26586 257/382 |
| 7,105,412 | B1 * | 9/2006 | Chen | H01L 21/26506 438/303 |
| 7,344,985 | B2 * | 3/2008 | Chen | H01L 21/26513 438/682 |
| 8,816,448 | B2 * | 8/2014 | Nishi | H01L 21/265 257/412 |
| 2007/0049022 | A1 * | 3/2007 | Chen | H01L 29/6659 438/682 |
| 2012/0241864 | A1 | 9/2012 | Gerhardt et al. | |

OTHER PUBLICATIONS

INPI Search Report and Written Opinion for FR 1905958 dated Jan. 17, 2020 (9 pages).

Yu, H., et al.: "$1.5 \times 10^{-9}$ $\Omega \cdot cm^2$ Contact Resistivity on Highly Doped Si:P Using Ge Pre-amorphization and Ti Silicidation," https://www.researchgate.net/publication/287996684, Dec. 24, 2015, 5 pages.

Lachal, Laurent, et al: "Effects of pre-amorphization thickness and carbon implantation on NiPt/Si silicidation process," Sep. 1, 2018, 4 pages.

Ozcan, Ahmet S., et al: "Effects of temperature dependent pre-amorphization implantation on NiPt silicide formation and thermal stability on Si(100)," Applied Physics Letters 102, 172107 (2013), 4 pages.

* cited by examiner

CONTACTS FOR ELECTRONIC COMPONENT

PRIORITY CLAIM

This application claims the priority benefit of French Application for Patent No. 1905958, filed on Jun. 5, 2019, the content of which is hereby incorporated by reference in its entirety to the maximum extent allowable by law.

TECHNICAL FIELD

The present disclosure relates generally to electronic devices, and more particularly to semiconductor-based electronic components.

BACKGROUND

In an electronic device such as an integrated circuit, electronic components are connected to one another by electrically conductive links and thus form electronic circuits. In particular, certain components such as transistors, diodes, etc., comprise semiconductor regions electrically connected to the conductive links. Typically, a transistor, for example of the MOS type, comprises such semiconductor drain/source regions. For each of these semiconductor regions, the electrical connection is ensured by a contact area, or contact, that is to say, an electrically conductive region in direct contact with the semiconductor region.

SUMMARY

One embodiment addresses all or some of the drawbacks of known contacts.

One embodiment addresses all or some of the drawbacks of known methods for producing contacts with semiconductor regions.

One embodiment provides a method making it possible to obtain a contact of more uniform thickness than with the known methods.

One embodiment provides a method comprising: a) implanting, in a semiconductor region, atoms at a higher concentration in a peripheral part than in a central part; b) forming a metallic region covering the semiconductor region; and c) forming an intermetallic region from the metallic region and the semiconductor region.

According to one embodiment, in step a), implanting is done so as to cause an at least partial amorphization of at least the peripheral part.

According to one embodiment, in step a), said semiconductor region is located in and/or on a substrate, on the side of a face of the substrate, the semiconductor region having a flank part accessible to the atoms implanted in step a).

According to one embodiment, the implantation is performed along at least one oblique direction having an angle of attack relative to said flank smaller than an angle of attack relative to said face.

According to one embodiment, the implantation is performed along at least one oblique direction having an angle of attack relative to said face greater than or equal to 45°, preferably greater than 50°.

According to one embodiment, in step a), the implantation is performed along at least two oblique directions that are symmetrical relative to a direction orthogonal to said face.

According to one embodiment, the method comprises, before step a), forming a trench filled with an insulator delimiting the semiconductor region, and forming a divot on the surface of the insulator against the semiconductor region such that said flank part protrudes past the insulator.

According to one embodiment, step a) is carried out in the presence of a temporary layer covering the semiconductor region.

According to one embodiment, said atoms are suitable for slowing the formation of the material of said intermetallic region in step c).

According to one embodiment, the method comprises performing a heat treatment in step c).

According to one embodiment, the semiconductor region is doped.

According to one embodiment, the semiconductor region rests on another region, which is insulating or semi-conductive.

One embodiment provides a method for manufacturing a transistor comprising the implementation of a method as described.

According to one embodiment, in step a), implanting is performed along a direction located in a plane orthogonal to said face of the substrate and parallel to a length direction of the transistor.

One embodiment provides a device comprising the stacking of a semiconductor region and an intermetallic region, the device having, per surface unit, more atoms implanted in a peripheral part of the stack than in a central part of the stack.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
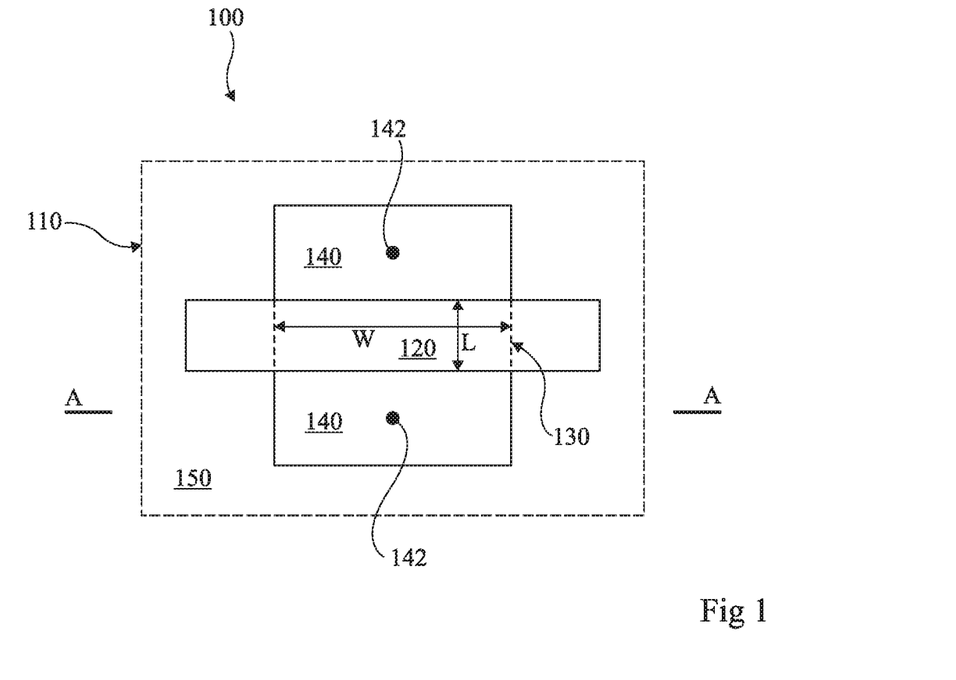
FIG. 1 is a top view schematically showing an exemplary electronic component to which the described embodiments apply.

FIG. 1 is a top view schematically showing an exemplary electronic component to which the described embodiments apply. More particularly, the electronic component is a transistor 100, but this is not limiting, the described embodiments being able to apply to any device comprising a semiconductor region configured to be electrically connected by means of a contact area.

The electronic component is located in and on a substrate 110. Preferably, the substrate 110 is semi-conductive, for example made from silicon-germanium or germanium, or preferably from silicon. The substrate 110 is, for example, a semiconductor trench portion. In a variant, the substrate 110 is a semiconductor layer covering a support. The substrate and the electronic component typically constitute a part of an integrated circuit electronic chip. Such a chip is defined by the substrate and elements, including electronic circuits, located in and on the substrate. Typically, the electronic circuits are located on the side of a front face of the substrate (upper face in the cross-sectional views of the following figures).

In the example of the transistor 100, the transistor comprises a gate 120 covering a channel formation region 130 located between drain/source doped semiconductor regions 140. The semiconductor regions 140 are in contact with contact areas 142 (shown very schematically). More specifically, the semiconductor regions 140 are located, along a length direction of the transistor L, on either side of the channel formation region 130. Typically, the gate 120 extends in the width direction W of the transistor 100 over a width greater than that, taken in the same direction, of the semiconductor regions 140. Preferably, the semiconductor regions 140 have rectangular shapes, the edges of which are parallel to the width and length directions. This rectangular shape is not limited to the example of the transistor. Furthermore, although here we have shown two semiconductor regions intended to be connected, the electronic component may comprise only one or more than two semiconductor regions, preferably doped, in contact with contact areas.

The semiconductor regions 140 are preferably delimited by isolation trenches 150, typically trenches of the STI (Shallow Trench Isolation) type. Such trenches result from etching delimiting the semiconductor region(s) and filling, by an electrical insulator, of the etched parts. The insulator is, for example, an oxide, such as a silicon oxide.

FIGS. 2 to 8 are sectional schematic views showing steps of an embodiment of a method for forming a contact. More specifically, the method is implemented during the production of an electronic component like that of FIG. 1. FIGS. 2 to 8 use, as section plane, a plane A-A, shown in FIG. 1, passing through a semiconductor region 140 of the electronic component. In the particular case of the illustrated transistor 100, the section plane is parallel to the width direction of the transistor. The gate 120, although preferably formed before the steps of FIGS. 2 to 8, is not shown in FIGS. 2 to 8.

Although the method is described here for a single semiconductor region 140, the method can be implemented to produce contacts simultaneously on a plurality of semiconductor regions of electronic components of a device such as an electronic chip.

The steps described here allow the formation of an intermetallic contact area, that is to say, a region made from an intermetallic material. Such an intermetallic material, also called intermetallic compound, or intermetallic, is defined by the combination of one or more metallic chemical elements and one or more chemical elements, typically metalloids, able to be included in the composition of a semiconductor. Preferably, the nonmetallic atoms of the intermetallic compound are of the same chemical element as the semiconductor region 140.

The formation steps of the elements of the electronic component other than the contact, such as the gate, are not described in detail, the described embodiments and their variants being compatible with the usual methods for manufacturing electronic components.

Figure 2:
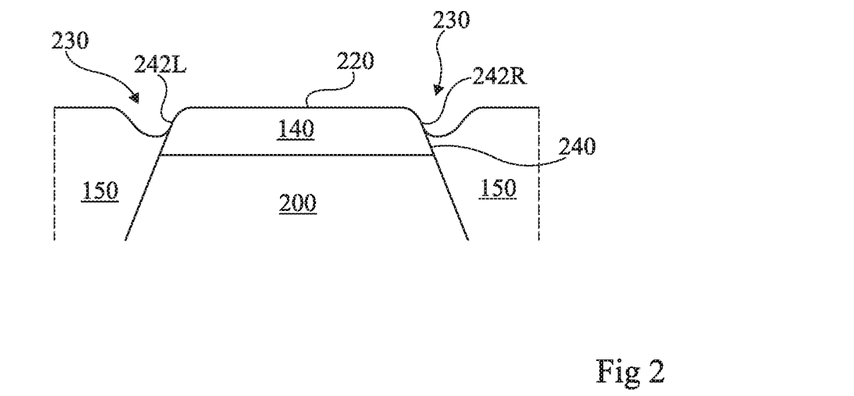
FIG. 2 is a sectional schematic view showing a step of an embodiment of a method for forming a contact.

In the step of FIG. 2, the semiconductor region 140 has been formed previously. Preferably, the semiconductor region 140 is made from silicon. As an example, the semiconductor region 140 is doped before the step of FIG. 2. In a variant, a doping of the semiconductor region is done in a later step. Preferably, the semiconductor region 140 rests on another region (region 200). The region 200 is preferably a semiconductor region. More preferably, the region 200 has a type of conductivity, or type of doping among the N and P types, different from that of the semiconductor region 140. In a variant, the region 200 is an insulating region, for example made up of a portion of insulating layer of a structure of the semiconductor on insulator (SOI) type. Such a structure is defined by stacking a support substrate, an insulating layer and a semiconductor layer covering the insulating layer. The semiconductor region 140 is then a portion of the semiconductor layer of the SOI structure. As an example, the thickness of the semiconductor region 140 is between 5 nm and 50 nm.

Preferably, the semiconductor region 140 has a planar upper face 220. The plane of the face 220 is preferably parallel to the plane of the front face of the substrate 110 (FIG. 1), that is to say, in the case of an electronic chip, to the mean plane comprising the components of the electronic chip. In one example, this mean plane is parallel to the opposite main faces of the semiconductor trench portion or the layer making up the substrate 110.

Preferably, before the step of FIG. 2, the isolation trenches have further been formed 150. In the illustrated example, two trenches 150 are located on either side of the semiconductor region 140.

In the step of FIG. 2, one or more cleaning and/or stripping operations have previously been done of residual elements such as oxides, not shown, covering the semiconductor region 140, and in particular its face 220. These cleaning or stripping operations typically take place during preceding steps for forming various elements of the electronic component. For example, these cleaning and/or stripping operations are implemented in usual steps for manufacturing drain/source regions and the gate of a transistor. Part of the insulator of the trenches 150 is thus etched at the same time as the residual elements eliminated during these cleaning or stripping operations. Pits 230, or divots, are thus formed on the surface of the insulator of the trenches 150.

The divots 230 result from the etching by a chemical etching solution, and are due to faster etching speeds of the insulator of the trench 150 close to the semiconductor region 140 than further from the semiconductor region 140. This difference in etching speed is due to various phenomena such as local concentration variations of the chemical solution during etching. A cleaning and/or stripping operation causing the formation of divots 230 is easier to perform than a cleaning and/or stripping operation not forming divots.

The semiconductor region 140 has flanks 240 each made up of an upper part of a wall of a trench 150. The example of more than one flank is not limiting, and, depending on the type of component, the semiconductor region can be delimited by a trench on a single side and have a single flank 240 made up of a wall of a trench 150.

Upper parts 242L, 242R of the flanks 240 protrude from the surface of the insulator of the trenches 150. In other words, the upper parts 242L, 242R of the flanks 240 of the semiconductor region 140 are accessible, that is to say, freed or exposed or uncovered. In the present embodiment, these parts of the flanks have been made accessible due to the presence of the divots 230 in the insulator of the trenches, the insulator of the trenches 150 having, for example outside the divots 230, a level above that of the face 220. This embodiment is not limiting, the described embodiments being compatible with any semiconductor region 140 whereof the flanks, in the step of FIG. 2, protrude from the upper surface of an insulator of the trenches or protrude from any element located against the semiconductor region 140.

Figure 3:
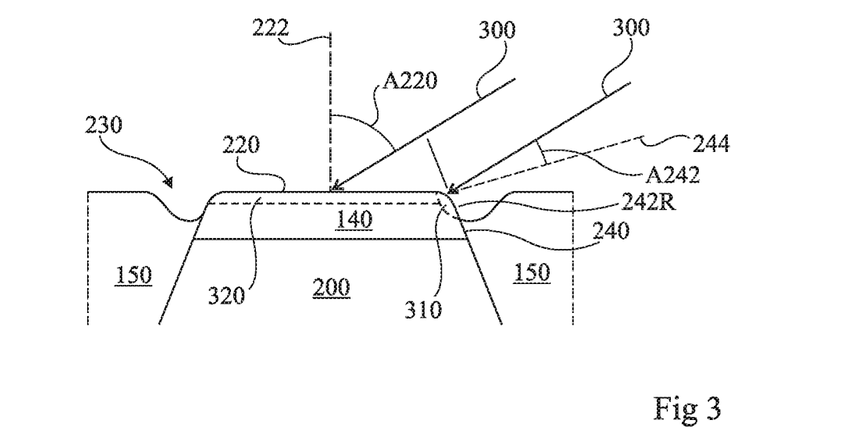
FIG. 3 is a sectional schematic view showing another step of the method.

In the step of FIG. 3, atoms are implanted (arrows 300) in the semiconductor region. The atoms are preferably implanted in ionic form, in other words by ionic implantation.

Thus, after implantation, the semiconductor region 140 contains implanted atoms, that is to say, atoms present in the semiconductor region after having passed through part of the semiconductor region. The presence of these atoms and their passage through part of the semiconductor region cause disorders in the crystalline array of the semiconductor region. Preferably, the energy of the implanted atoms is chosen as a function of the mass of the implanted atoms and the thickness of the future intermetallic region such that the implantation depth in the semiconductor region is less than 120% of the thickness of the future intermetallic region. Preferably, the atoms are implanted with an energy of between 1 keV and 40 keV.

Preferably, the implanted atoms and their implantation energy are chosen as a function of the intermetallic energy of the future intermetallic region such that, during following steps of the method, the implanted atoms slow the formation of the intermetallic material.

As an example, for an intermetallic compound comprising, or made up of, nickel silicide NiSi, the implanted atoms can be carbon atoms. In another example, the intermetallic compound comprises, or is made up of, a nickel and platinum silicide. In such a compound, preferably, between 5 and 15% of the metallic atoms are platinum atoms, for example the compound is $Ni_{0.9}Pt_{0.1}Si$. For this compound, the implanted atoms are, for example, one or more from among carbon, silicon, argon, gallium, germanium, arsenic, indium and xenon. In still another example, the intermetallic compound comprises, or is made up of, cobalt silicide $CoSi_2$, and the implanted atoms are one or more from among carbon, silicon, argon, gallium, germanium, arsenic, indium and xenon. In still another example, the intermetallic compound comprises, or is made up of, titanium silicide $TiSi_2$, and the implanted atoms are one or more from among carbon, silicon, argon, gallium, germanium, arsenic, selenium, tin and antimony.

These specific examples are not limiting. In particular, the described embodiments are compatible with any intermetallic whose nonmetallic atoms are part of the composition of the semiconductor region 140. Furthermore, the described embodiments are compatible with any chemical element whose implantation slows the formation of the intermetallic material, this chemical element being a usual chemical element or being able to be obtained through routine tests.

The implantation is done along an oblique direction, that is to say, having an angle of attack A220 relative to the face 220. In other words, the implantation is done with an angle of attack relative to the front face of the substrate. An angle of attack relative to a face is defined by the angle between the direction orthogonal to the concerned face (that is to say, here, the direction 222 orthogonal to the face 220 and the front face of the substrate) and the direction of origin of the implanted atoms. The angle of attack A220 is greater than or equal to 45°, preferably strictly greater than 45°, more preferably between 50° and 70°, still more preferably about 60°, for example 60°.

Preferably, the implantation direction has, relative to the upper part of one of the flanks 240, for example the part 242R, an angle of attack A242 smaller than the angle of attack A220. The angle of attack A242 is the angle between a direction 244 orthogonal to a rectilinear part of the surface of the flank part 242R, and the implantation direction. For example, the angle of attack A242 relative to the flank part 242R is two times smaller than the angle of attack A220 relative to the upper face 220.

With such an oblique implantation, the number of atoms implanted per surface unit is higher on the flank part 242R than on the upper face 220. The number of atoms implanted per surface unit of the upper face 220 corresponds to the number of atoms implanted per surface unit of the front face of the device, and is smaller than the number of atoms per unit of a surface orthogonal to the implantation direction. As an example, for each $cm^2$ of surface area of the front face of the device, between $2 \times 10^{14}$ and $2 \times 10^{16}$ atoms are implanted.

One has thus obtained, in a peripheral part 310 of the semiconductor region 140, a higher concentration of implanted atoms than in the central part 320 of the semiconductor region 140. More specifically, the number of atoms implanted in the peripheral part 310 per surface unit of the flank 240 is higher than the number of atoms implanted in the central part 320 per surface unit of the upper face 220. As a result, the number of atoms implanted per surface unit of the front face of the device (that is to say, the surface seen from above) is higher in the peripheral part 310 than in the central part 320.

Due to the higher concentration of atoms implanted in the peripheral part 310 than in the central region 320, the peripheral part 310 has a higher level of crystalline disorder than that of the central part 320. Thus, the peripheral part is at least partially amorphized, for example more than 10%, preferably more than 30% of its material is amorphized, a material being said to be amorphized when more than 25%, preferably more than 33% of its crystalline order is lost.

The angle of attack A220 is chosen to be small enough, preferably less than 80%, to avoid shadow effects due to the upper part of the insulator of the trenches 150, or to elements, not shown, higher than the semiconductor region 140, or to any irregularities of the face 220 of the semiconductor region. Preferably, in the case where the electronic component is a transistor and where a plurality of transistors of like length direction are manufactured simultaneously, the implantation direction is located in a plane orthogonal to the front face (that is to say, a vertical plane) and parallel to the length direction of the transistors. Such a plane is parallel to the section plane of FIGS. 2 to 8. One thus avoids the shadow effects due to the gates of the transistors. Furthermore, this plane is orthogonal to the concerned flank 240, which allows a concentration of atoms implanted in the highest part 310 only if the implantation was done parallel to another plane.

Figure 4:
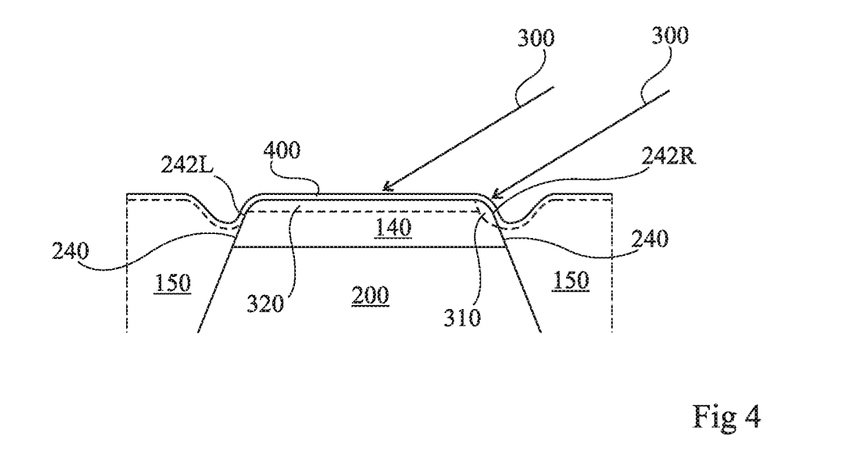
FIG. 4 is a sectional schematic view showing a variant of the step of FIG. 3.

The step of FIG. 4 illustrates a variant of the step of FIG. 3. In this variant, before the implantation, it is provided to form a temporary layer 400 covering the upper face 220 of the semiconductor region 140. For example, the temporary layer 400 covers the entire structure of FIG. 2. In another variant, one of the cleaning steps described in relation with FIG. 2 is omitted, and the layer 400 is then a residual layer resulting from the manufacture of other elements of the electronic component.

Preferably, the temporary layer 400 can be selectively etched relative to the semiconductor region 140, so as to be able to be removed without damaging the semiconductor region 140. The thickness of the temporary layer 400 is then enough so that the face 220 and the flank parts 242L and 242R remain accessible to the implanted atoms. To that end, the thickness of the temporary layer 400 is for example less than 5 nm, preferably less than 3 nm. Preferably, the temporary layer is a conformal layer, for example of silicon oxide or silicon nitride.

The implantation is next done in the manner described in relation with FIG. 3. Because the angle of attack A242 (FIG. 3) relative to the flank part 242R is smaller than the angle of attack A220 (FIG. 3) relative to the upper face 220, the path of the particles implanted in the temporary layer 400 is longer on the upper face 220 than on the flank part 242R. Relative to an implantation done without a temporary layer, this enables the difference between the concentrations of atoms implanted in the peripheral part 310 and in the central part 320 to be increased. In a variant, the temporary layer is a non-conformal layer, and the temporary layer is located only on the upper face 220 of the region 140, or is less thick on said flank than on the upper face 220, which here again allows the difference between the concentrations of atoms implanted in the peripheral part and the central part to be increased.

Figure 5:
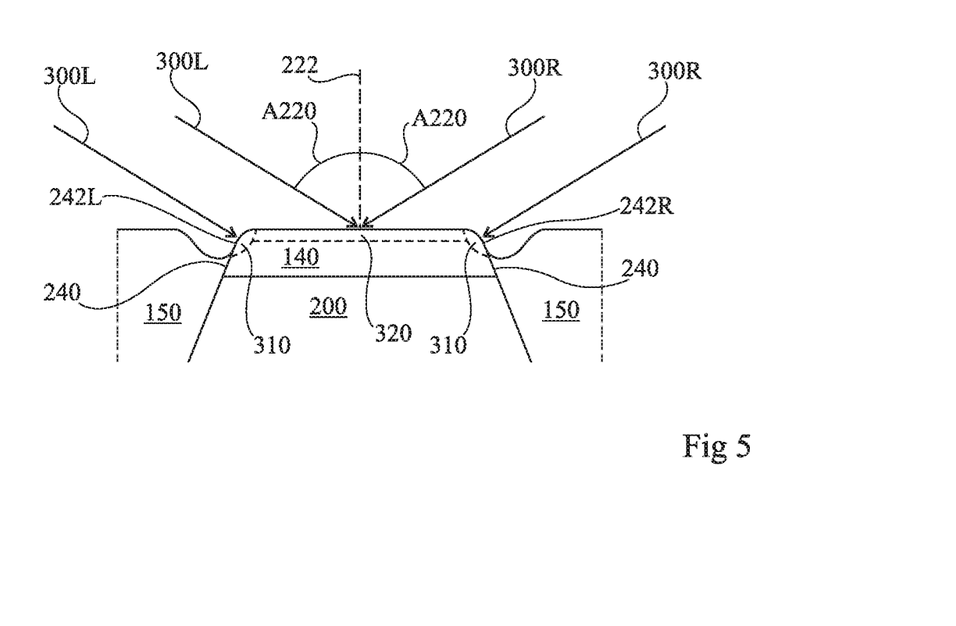
FIG. 5 is a sectional schematic view showing another variant of the step of FIG. 3.

The step of FIG. 5 is another variant of the step of FIG. 3. This variant is compatible with the presence of the temporary layer 400 of the variant of FIG. 4.

In this variant, two implantations 300R and 300L are done, each similar or identical to the implantation 300 of FIG. 3. Preferably, the implantations 300R and 300L are of the same chemical species, same energy, same number of atoms per surface unit, same angle of attack A220 relative to the front face of the device, and have symmetrical implantation directions relative to the direction 222 orthogonal to the front face of the device. This allows a peripheral part 310 with a higher concentration of implanted atoms than that of the central part 320 to be formed on the side of each of the flanks 242L, 242L opposite the semiconductor region 140. The angle of attack A220 is then preferably greater than a value for which the number of incident atoms per surface unit is, for each implantation, more than twice as high on the concerned flank than on the front face. As an example, for flanks 240 that are orthogonal to the front face (that is to say, vertical), the angle of attack is greater than 64°. Thus, after the two implantations, the total number of particles implanted per surface unit is higher on the two flank parts 242L and 242L than on the upper face 220.

The steps and variants described above in order to obtain a higher concentration of implanted atoms in the peripheral part 310 than in the central part 320 are not limiting. In one variant, the temporary layer 400 is present only on the central part 320. The angle of attack can then assume any value, for example the nil value. However, relative to this variant, the temporary layer completely covering the semiconductor region, or the absence of temporary layer, has the advantage of self-alignment of the parts 310 and 320 with the semiconductor region 140.

Figure 6:
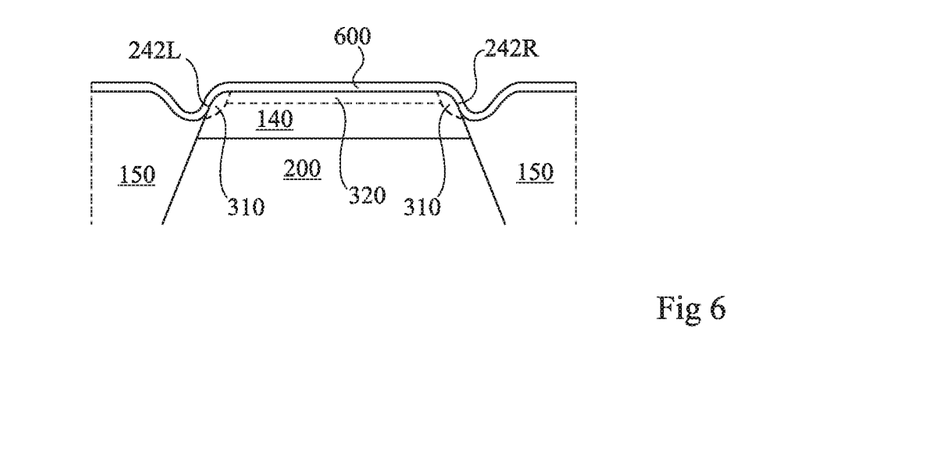
FIG. 6 is a sectional schematic view showing another step of the method.

In the step of FIG. 6, a metallic region 600 is formed covering the semiconductor region 140 of the structure obtained at the end of one of the steps and variants described in relation with FIGS. 3, 4 and 5. Before formation of the region 600, any temporary layer 400 has previously been removed. As an example, the region 600 is part of a conformal layer that is formed on the entire structure. The described embodiments are compatible with the usual methods for forming a metallic region.

The material of the metallic region 600 is made up of metallic atoms of the same metallic chemical element as the metallic atoms of the future intermetallic compound. Preferably, the thickness of the metallic layer is between 5 and 30 nm.

Figure 7:
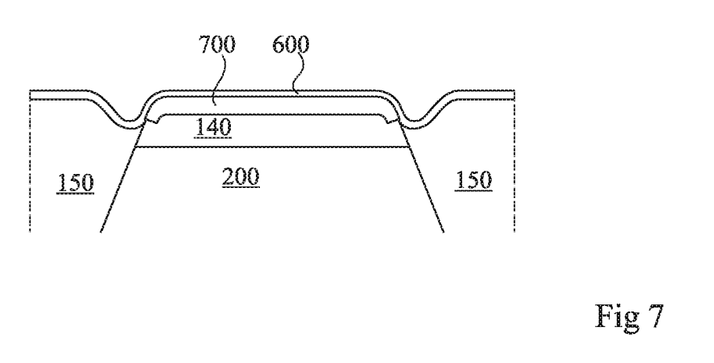
FIG. 7 is a sectional schematic view showing another step of the method.

In the step of FIG. 7, an intermetallic region 700 is formed from the metallic region 600 and the semiconductor region 140. More specifically, to that end, all or part of the metallic region 600 is reacted with the semiconductor region 140. This reaction is preferably obtained by a heat treatment.

More specifically, during the reaction, part or all of the metallic region and part of the semiconductor region are transformed into the intermetallic region 700. As an example, atoms of the metallic region 600 diffuse in the parts of the semiconductor region 140 in contact with the metallic region 600. As an example, the atoms of the semiconductor region 140 diffuse toward the metallic region 600.

Preferably, it is provided that a part of the metallic region 600 is not located on the region 140 and therefore does not react during the step of FIG. 7. The metallic region 600 is thus easier to produce than a metallic region that would be located only on the semiconductor region 140.

Figure 8:
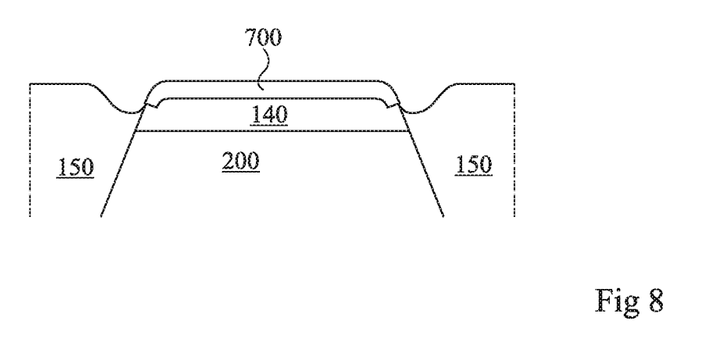
FIG. 8 is a sectional schematic view showing another step of the method.

In the step of FIG. 8, the parts of the metallic region 600, for example located on the trenches 150, that did not react in the step of FIG. 7 are removed selectively, for example by chemical etching.

Preferably, an additional heat treatment is provided, in the step of FIG. 8, in order to finalize the formation of the intermetallic. Preferably, the parameters, such as the temperature and/or the duration of the heat treatment and any additional heat treatment, are chosen so that the metallic and non-metallic atoms of the intermetallic region are in proportions allowing a maximal electrical conductivity, for example NiSi or $CoSi_2$. For example, the electrical resistivity is close to 15 μOhm.cm in the case of NiSi or $CoSi_2$ intermetallics.

The steps of FIGS. 7 and 8 are described as an example, the described embodiments being compatible with the usual steps for obtaining an intermetallic from a stack of semiconductive and metallic regions in contact with one another. In particular, the embodiments are compatible with the temperatures, durations and any gases and pressures of the usual heat treatments for the formation of an intermetallic region.

In the obtained device, the stack of the semiconductor region 140 and the intermetallic region 700 has, per surface unit of the front face, more atoms implanted in a peripheral part of the stack than in a central part of the stack.

One may have thought to produce an intermetallic region without providing for implantation, or without providing a higher concentration of implanted atoms in a peripheral part than in a central part. The intermetallic region would then have presented a much greater thickness, for example more than 2 times greater, close to the flanks of the semiconductor region than in the central part. This would have raised various problems, such as short-circuit problems with the region 200 when the region 200 is semi-conductive. In the case where the region 200 is insulating, this would have raised various problems during operation with distribution of the current in the region 140, leading, for example, to a reduction of the effective width of the transistor.

By comparison, due to the higher concentration of atoms implanted in the peripheral part of the region 140, the formation of the intermetallic is slowed in the peripheral part. As a result, the intermetallic region 700 has fewer thickness variations than an intermetallic region formed without providing a higher concentration of implanted atoms on the periphery than in the central part. Preferably, the thickness of the obtained intermetallic region remains between 10 nm and 40 nm, and more preferably less than 30 nm, over the entire semiconductor region 140.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The invention claimed is:

1. A method, comprising:
    forming a trench filled with an insulator to produce an isolation region that delimits a semiconductor region having a top surface and a flank surface extending downwardly from said top surface;
    wherein forming includes producing a divot in an upper surface of the isolation region between the isolation region and the semiconductor region that exposes a portion of said flank surface;
    a) implanting, in the top surface and exposed portion of the flank surface of said semiconductor region, atoms at a higher concentration in a peripheral part of the semiconductor region at said exposed portion of the flank surface than in a central part of the semiconductor region;
    b) forming a metallic region covering the top surface and exposed portion of the flank surface of said semiconductor region; and
    c) forming an intermetallic region from the metallic region and the semiconductor region.

2. The method according to claim 1, wherein step a) comprises performing the implantation of atoms to cause an at least partial amorphization of at least the peripheral part.

3. The method according to claim 1, wherein said semiconductor region is located in and/or on a substrate.

4. The method according to claim 1, wherein implanting in step a) is performed along at least one oblique direction having an angle of attack relative to said exposed portion of the flank surface that is smaller than an angle of attack relative to said top surface.

5. The method according to claim 1, wherein implanting in step a) is performed along at least one oblique direction having an angle of attack relative to said top surface that is greater than or equal to 45°.

6. The method according to claim 1, wherein implanting in step a) is performed along at least one oblique direction having an angle of attack relative to said top surface that is greater than 50°.

7. The method according to claim 1, wherein implanting in step a) is performed along at least two oblique directions that are symmetrical relative to a direction orthogonal to said top surface.

8. The method according to claim 1, wherein implanting in step a) is performed along at least one oblique direction to implant more atoms in the peripheral part of the semiconductor region adjacent said exposed flank surface than at the central part.

9. The method according to claim 1, further comprising, before step a), depositing a temporary layer covering the exposed portion of the flank surface and the top surface of the semiconductor region, and wherein implanting in step a) is performed through said temporary layer.

10. The method according to claim 9, wherein implanting in step a) is performed along at least one oblique direction to implant more atoms in the peripheral part of the semiconductor region adjacent said exposed flank surface than at the central part.

11. The method according to claim 1, wherein said atoms are configured to slow the formation of the material of said intermetallic region in step c).

12. The method according to claim 1, wherein forming the intermetallic region in step c) includes performing a heat treatment.

13. The method according to claim 1, wherein the semiconductor region is doped.

14. The method according to claim 1, wherein the semiconductor region rests on another region, which is insulating or semi-conductive.

15. The method according to claim 1, wherein the semiconductor region is a doped source or drain region of a transistor.

* * * * *